United States Patent
Jeon (10) Patent No.: US 12,426,463 B2
(45) Date of Patent: Sep. 23, 2025

(54) LIGHT EMITTING DISPLAY DEVICE

(71) Applicant: LG Display Co., Ltd., Seoul (KR)

(72) Inventor: Seo Il Jeon, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 548 days.

(21) Appl. No.: 17/977,319

(22) Filed: Oct. 31, 2022

(65) Prior Publication Data

US 2023/0217745 A1 Jul. 6, 2023

(30) Foreign Application Priority Data

Dec. 31, 2021 (KR) .................. 10-2021-0194797

(51) Int. Cl.
| | |
|---|---|
| *H10K 59/131* | (2023.01) |
| *H10D 86/40* | (2025.01) |
| *H10D 86/60* | (2025.01) |
| *H10K 59/121* | (2023.01) |
| *H10K 59/122* | (2023.01) |
| *H10K 59/38* | (2023.01) |

(52) U.S. Cl.
CPC ......... *H10K 59/131* (2023.02); *H10D 86/441* (2025.01); *H10D 86/60* (2025.01); *H10K 59/1213* (2023.02); *H10K 59/1216* (2023.02); *H10K 59/122* (2023.02); *H10K 59/38* (2023.02)

(58) Field of Classification Search
CPC ............... H10D 86/441; H10D 86/451; H10K 59/1216; H10K 59/126; H10K 59/351; H10K 50/816; H10K 50/841
See application file for complete search history.

(56) References Cited

U.S. PATENT DOCUMENTS

2016/0190218 A1* 6/2016 Jeong ................ H10K 59/38
257/40

FOREIGN PATENT DOCUMENTS

| KR | 10-2015-0077270 A | 7/2015 |
|---|---|---|
| KR | 10-2017-0077887 A | 7/2017 |
| KR | 10-2017-0081102 A | 7/2017 |

* cited by examiner

*Primary Examiner* — Fernando L Toledo
*Assistant Examiner* — Adam S Bowen
(74) *Attorney, Agent, or Firm* — Birch, Stewart, Kolasch & Birch, LLP (57) ABSTRACT

Discussed is a light emitting display device having a slit provided in a source voltage line, whereby it is possible to reduce a foreign matter generation area, prevent light leakage due to the source voltage line, and reduce parasitic capacitance. To this end, the light emitting display device can include a white subpixel and a color subpixel disposed on a substrate so as to be adjacent to each other. Each of the white subpixel and the color subpixel can have an emission portion and a driving circuit. The light emitting display device can further include a source voltage line extending between the white subpixel and the color subpixel and having a slit parallel to the emission portions, a color filter overlapping the emission portion of the color subpixel and the slit, and an anode provided at each subpixel so as not to overlap the slit.

19 Claims, 8 Drawing Sheets

LIGHT EMITTING DISPLAY DEVICE

CROSS-REFERENCE TO RELATED APPLICATIONS

This application claims priority to Korean Patent Application No. 10-2021-0194797, filed in the Republic of Korea on Dec. 31, 2021, the entire contents of which are hereby expressly incorporated by reference into the present application.

BACKGROUND OF THE INVENTION

Field of the Invention

The present invention relates to a display device, and more particularly to a light emitting display device capable of preventing parasitic capacitance as well as foreign matter and structurally preventing light leakage due to adjacent subpixels.

Discussion of the Related Art

A light emitting display device having a light emitting element provided in a display panel without a separate light source in order to achieve compact design and vivid color display has been considered as a competitive application.

The light emitting display device includes a white subpixel and color subpixels in order to express various colors. However, there can be a limitation in that light generated between the color subpixels can be observed in the form of light leaked at the white subpixel.

In addition, the light emitting display device is formed to have various sizes. As the area of the light emitting display device is increased, the area of a metal wire can be increased and parasitic capacitance can be increased, whereby reliability of the device can be lowered.

SUMMARY OF THE INVENTION

Accordingly, the present invention is directed to a light emitting display device that substantially obviates one or more problems due to limitations and disadvantages of the related art.

It is an object of the present invention to provide a light emitting display device configured such that a slit is provided in a source voltage line, whereby it is possible to reduce a foreign matter clinging area, prevent light leakage due to the source voltage line, and reduce parasitic capacitance.

Additional advantages, objects, and features of the invention will be set forth in part in the description which follows and in part will become apparent to those having ordinary skill in the art upon examination of the following or can be learned from practice of the invention. The objectives and other advantages of the invention can be realized and attained by the structure particularly pointed out in the written description and claims hereof as well as the appended drawings.

To achieve these objects and other advantages and in accordance with the purpose of the invention, as embodied and broadly described herein, a light emitting display device can include a white subpixel and a color subpixel disposed on a substrate so as to be adjacent to each other, each of the white subpixel and the color subpixel having an emission portion and a driving circuit, a source voltage line extending between the white subpixel and the color subpixel adjacent to each other, the source voltage line having at least a first slit parallel to the emission portions while being adjacent thereto, a color filter overlapping the emission portion of the color subpixel and the first slit, a first light emitting element including a first anode provided at the white subpixel so as not to overlap the first slit, and a second light emitting element including a second anode provided at the color subpixel so as not to overlap the first slit.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE EMBODIMENTS

Advantages and features of the present disclosure and methods of achieving the same will be more clearly understood from embodiments described below with reference to the accompanying drawings. However, the present disclosure is not limited to the following embodiments and can be implemented in various different forms. The embodiments are provided merely to complete the disclosure of the present disclosure and to fully inform a person having ordinary skill in the art to which the present disclosure pertains of the category of the invention. The invention is defined only by the category of the claims.

In the drawings for explaining the exemplary aspects of the present disclosure, for example, the illustrated shape, size, ratio, angle, and number are given by way of example, and thus, are not limited to the disclosure of the present disclosure. Throughout the present specification, the same reference numerals designate the same constituent elements. In addition, in the following description of the present disclosure, a detailed description of known functions and configurations incorporated herein will be omitted or may be provided briefly when it can make the subject matter of the present disclosure rather unclear. The terms "comprises," "includes," and/or "has", used in this specification, do not preclude the presence or addition of other elements unless used along with the term "only". The singular forms are intended to include the plural forms as well, unless the context clearly indicates otherwise.

In the interpretation of constituent elements included in the various aspects of the present disclosure, the constituent elements are interpreted as including an error range even if there is no explicit description thereof.

In the description of the various aspects of the present disclosure, when describing positional relationships, for example, when the positional relationship between two parts is described using "on", "above", "below", "next to", or the like, one or more other parts can be located between the two parts unless the term "directly" or "closely" is used.

In the description of the various aspects of the present disclosure, when describing temporal relationships, for example, when the temporal relationship between two actions is described using "after", "subsequently", "next", "before", or the like, the actions may not occur in succession unless the term "directly" or "just" is used therewith.

In the description of the various aspects of the present disclosure, although terms such as, for example, "first" and "second" can be used to describe various elements, these terms are merely used to distinguish the same or similar elements from each other, and may not define any order or sequence. Therefore, in the present specification, an element indicated by "first" can be the same as an element indicated by "second" without exceeding the technical scope of the present disclosure, unless otherwise mentioned.

The respective features of the various aspects of the present disclosure can be partially or wholly coupled to and combined with each other, and various technical linkages and modes of operation thereof are possible. These various aspects can be performed independently of each other, or can be performed in association with each other.

The following exemplary embodiments will be described based on an organic light emitting display. However, the embodiments of the present disclosure are not limited to the organic light emitting display device and can be applied to an inorganic light emitting display device including an inorganic light emitting material. In some case, light emitting material can be an organic material, or can be inorganic material such as quantum dots, nitride semiconductor or can be a compound comprising both inorganic material and organic material such as perovskite. Further, all the components of each light emitting display device according to all embodiments of the present invention are operatively coupled and configured.

Figure 1:
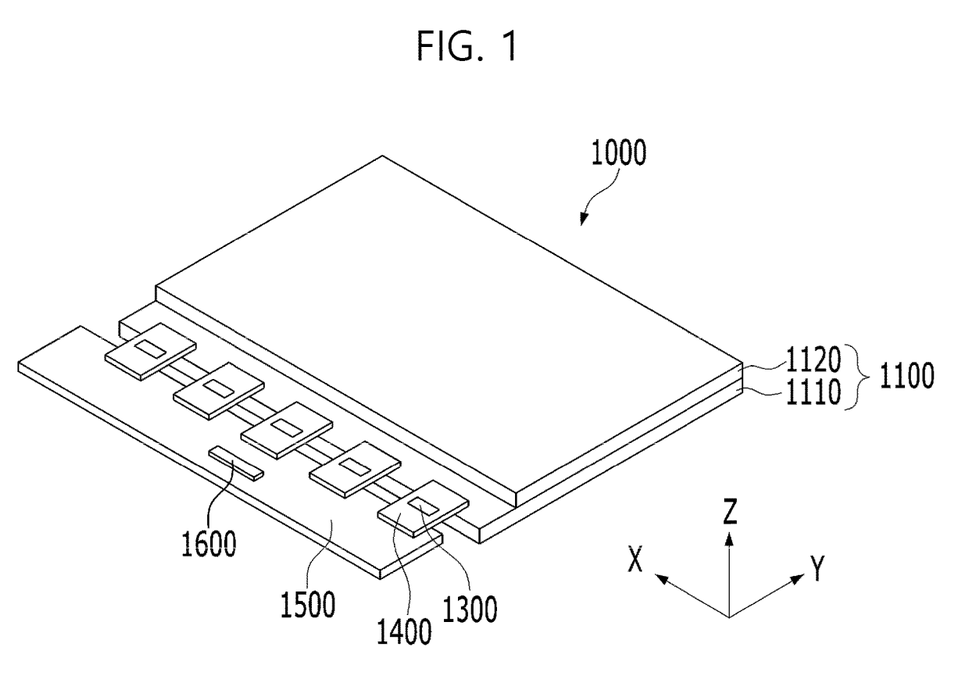
FIG. 1 is a perspective view showing a light emitting display device according to one or more embodiments of the present invention.
Figure 2:
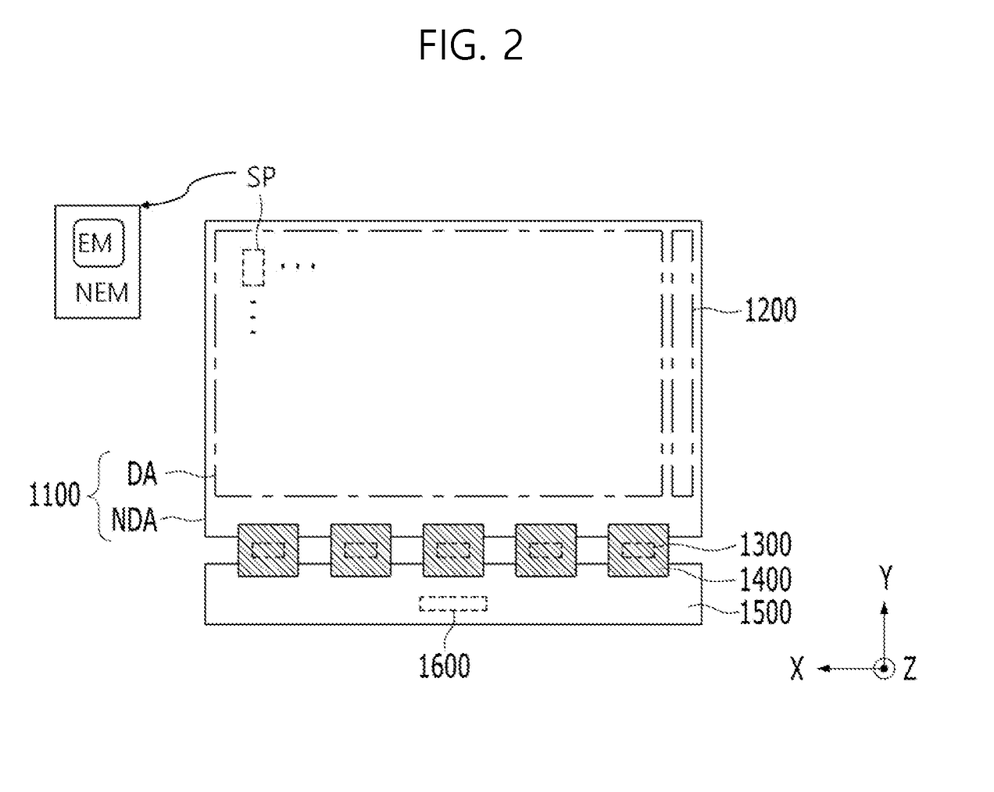
FIG. 2 is a plan view showing a substrate of FIG. 1.

FIG. 1 is a perspective view showing a light emitting display device according to one or more embodiments of the present invention, and FIG. 2 is a plan view showing a substrate of FIG. 1.

As shown in FIGS. 1 and 2, a light emitting display device 1000 according to one or more embodiments of the present invention can include a display panel 1100, a scan driver 1200, a flexible film 1400 including a data driver, a circuit board 1500, and a timing controller 1600. The flexible film 1400 can include a drive IC 1300, whereby the flexible film can function as the data driver. As shown, the flexible film 1400 can supply a data signal to a plurality of signal lines provided in the display panel 1100 through several blocks, and can detect a sensing signal, or can correspond to all signal lines provided in the panel 1100 so as to perform the function of the data driver. Depending on circumstances, the flexible film 1400 and the circuit board 1500 can be integrated.

The display panel 1100 can include an array substrate 1110 and an opposite substrate 1120. Each of the array substrate 1110 and the opposite substrate 1120 can include a glass or plastic substrate, and can further include a thin film transistor array, a color filter array, or an optical film. For example, when the array substrate 1110 includes the plastic substrate, the plastic constituting the substrate can be polyimide, polyethylene terephthalate (PET), polyethylene naphthalate (PEN), or polycarbonate (PC). When the array substrate 1110 includes the plastic substrate, the light emitting display device 1000 can be implemented by a flexible display device that can be curved or bent. The opposite substrate 1120 can include any one of glass, a plastic film, and an encapsulation film. When the opposite substrate 1120 is the encapsulation film, the encapsulation film can have a unit structure in which organic films and inorganic films are alternatively disposed, and the films can be formed on the array substrate 1110 without being bonded to the array substrate 1110.

The array substrate 1110 is a thin film transistor substrate on which thin film transistors are formed. Scan lines, signal lines, and subpixels SP are formed on one surface of the array substrate 1110 that faces the opposite substrate 110. The subpixels SP are provided at areas defined by intersections between the scan lines and signal lines. The scan lines are connected to the scan driver 1200, and the signal lines are connected to the data driver 1400. In addition, as shown, the scan driver 1200 can be directly mounted in a non-display area NDA of the array substrate 1110, or a separate drive IC or a printed circuit film can be connected to the non-display area NDA of the array substrate 1110.

As shown in FIG. 2, the display panel 1110 can be divided into a display area DA, in which the subpixels SP are formed to display an image, and a non-display area NDA, in which no image is displayed. The scan lines, the signal lines, and the subpixels SP can be formed in the display area DA. The scan driver 1200, pads, and link lines configured to connect the signal lines to the pads can be formed in the non-display area NDA.

Each subpixel SP can be divided into an emission portion EM, which substantially emits light, and a non-emission portion NEM disposed outside the emission portion EM, the non-emission portion NEM having wires and a driving circuit provided therein.

The non-emission portion NEM of the subpixel SP can include a plurality of transistors as switching elements configured to be turned on according to scan signals of the scan lines to receive data voltage of the signal lines. Each transistor can be a thin film transistor. The transistors of the subpixel SP can have the same stack structure having active layers (semiconductor layers) formed on the same layer or a hetero stack structure having active layers formed on different layers. This will be described below.

Hereinafter, subpixels of the light emitting display device according to one or more embodiments of the present invention will be described in detail.

Figure 3:
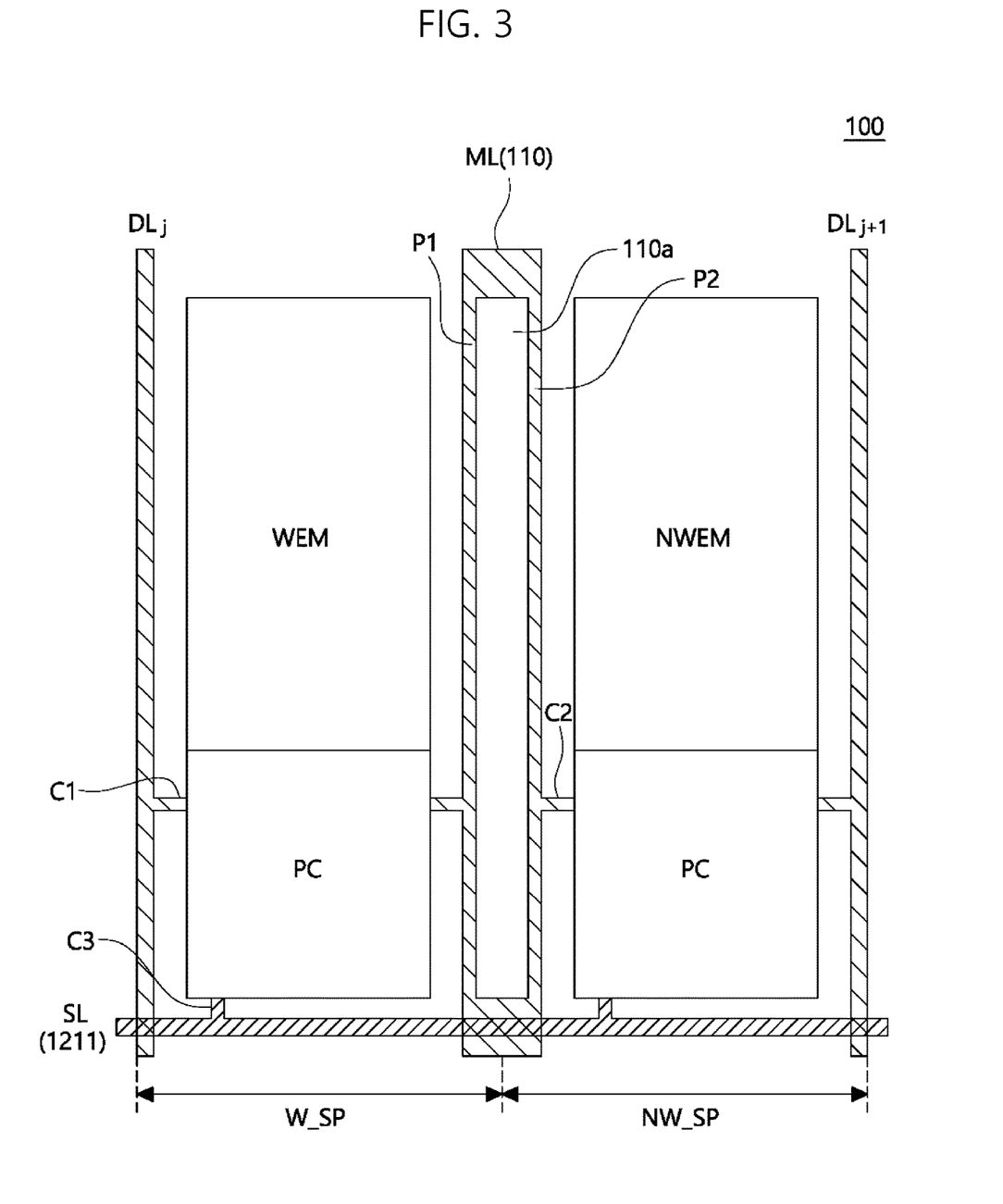
FIG. 3 is a plan view schematically showing a white subpixel and a color (non-white) subpixel adjacent to each other in the light emitting display device according to one or more embodiments of the present invention.

FIG. 3 is a plan view schematically showing a white subpixel and a color subpixel adjacent to each other in the light emitting display device according to one or more embodiments of the present invention.

As shown in FIG. 3, in the light emitting display device according to one or more embodiments of the present invention, a white subpixel W_SP and a color subpixel NW_SP (e.g., non-white subpixel) are disposed on a substrate 100 so as to be adjacent to each other.

The white subpixel W_SP and the color subpixel NW_SP respectively have emission portions WEM and NWEM and pixel circuits PC disposed so as to be adjacent to each other. A source voltage line ML 110 extending between the white subpixel W_SP and the color subpixel NW_SP is connected to the pixel circuits PC.

The pixel circuit PC includes a plurality of thin film transistors and a storage capacitor, and is provided in each subpixel. The pixel circuit PC of each subpixel can be connected to data lines DLj, DLj+1, . . . (e.g., j being a positive number) parallel to the source voltage line ML 110 through a first connection portion C1, can be connected to the source voltage line ML 110 through a second connection portion C2, and can be connected to a scan line SL 1211 through a third connection portion C3.

In the light emitting display device according to one or more embodiments of the present invention, the source voltage line ML 110, which is a line that applies constant source voltage, can be a line that applies VDD source voltage (driving source voltage), a line that applies VSS source voltage (ground source voltage), or a line that applies VREF source voltage (reference source voltage). Compared to the data line DL or the scan line SL disposed at each subpixel, the source voltage line ML 110 is shared by a plurality of subpixels. In addition, the source voltage line is formed so as to have a larger width than the data line DL in order to apply a continuous signal for a predetermined time period.

Meanwhile, in the light emitting display device according to one or more embodiments of the present invention, the source voltage line ML 110 has a slit 110a, as shown in FIG. 3, to form an optical path that transmits a side light from the color subpixel to the silt 110a, not to propagate the side light to the white subpixel adjacent to the color subpixel which generates the side light. Thus, it is possible to prevent light emitted from the color subpixel from being visible in the white subpixel, in the light emitting display device according to one or more embodiments of the present invention.

In FIG. 3, a light emitting element including an anode and an organic layer including an emission layer and a cathode provided thereon is formed in each of the emission portions WEM and NWEM, and a color filter is provided under the light emitting element for the color subpixel NW_SP, whereby color expression is possible.

Meanwhile, the color subpixel NW_SP can be any one of a red subpixel, a green subpixel, and a blue subpixel. Depending on circumstances, the color subpixel NW_SP can be another color subpixel when a white color is implemented through a combination of other different colors. For example, when a white color is implemented through a combination of cyan, magenta, and yellow, the color subpixel can be any one of a cyan subpixel, a magenta subpixel, and a yellow subpixel.

FIG. 3 schematically shows the relationship between the emission portion WEM of the white subpixel and the emission portion NWEM of the color subpixel having the source voltage line ML 110 disposed therebetween, wherein the emission portion WEM of the white subpixel and the emission portion NWEM of the color subpixel can be spaced apart from each other in different manners. For example, the emission portion WEM of the white subpixel and the emission portion NWEM of the color subpixel can directly abut the source voltage line ML 110. Alternatively, each of the emission portions WEM and NWEM can be polygonal, not quadrangular, and can have rounded corners. In addition, the source voltage line ML 110 disposed between the emission portion WEM of the white subpixel and the emission portion NWEM of the color subpixel can be inclined at an upper side or a lower side of each of the emission portion WEM of the white subpixel and the emission portion NWEM of the color subpixel, not be completely vertical, so as to correspond to changed shapes of the emission portion WEM of the white subpixel and the emission portion NWEM of the color subpixel.

Hereinafter, the overlap relationship between a source voltage line and another layer in a light emitting display device according to an embodiment of the present invention will be described with reference to a plan view and a sectional view.

Figure 4:
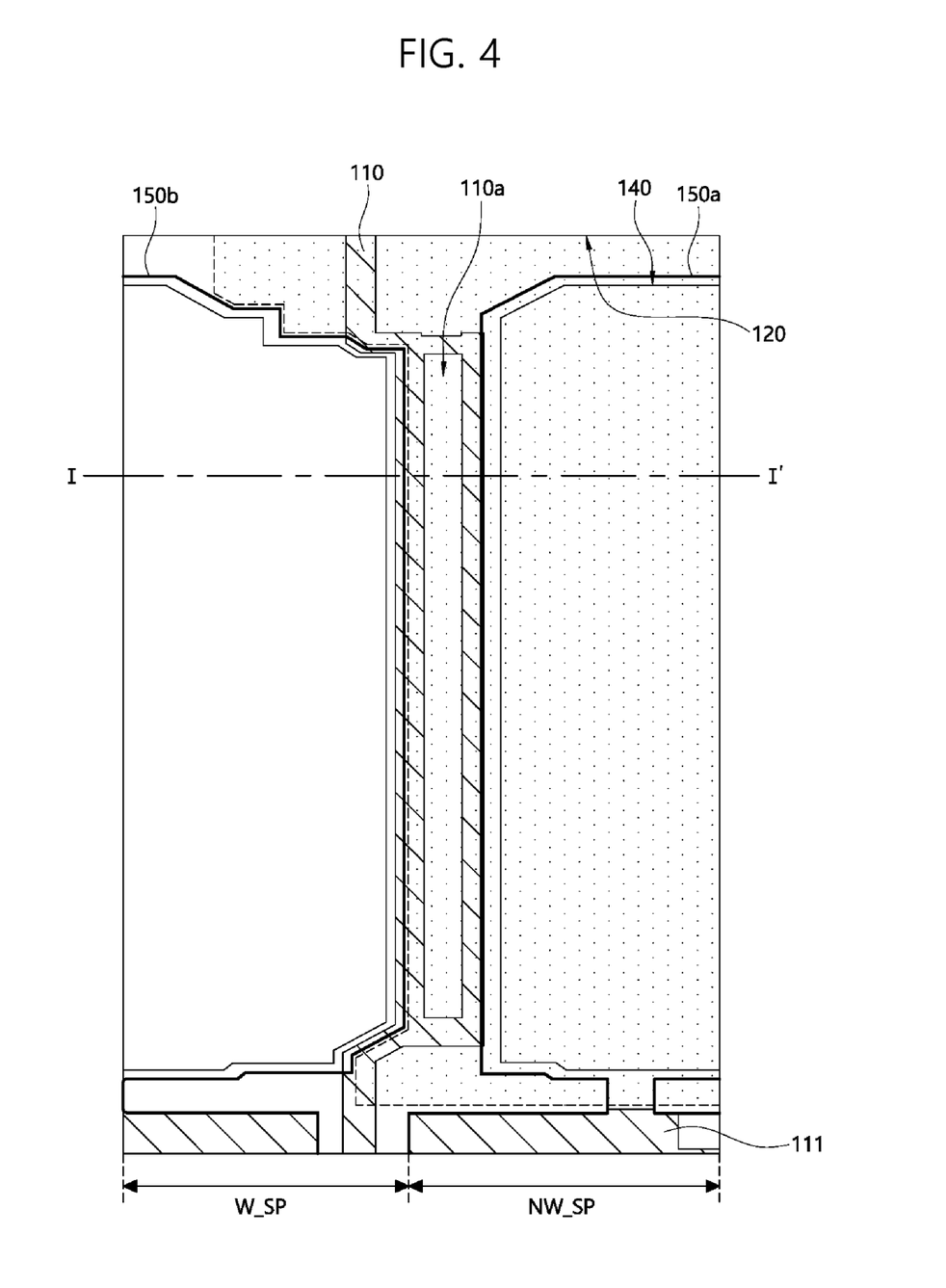
FIG. 4 is a plan view showing a white subpixel and a color (non-white) subpixel provided on opposite sides of a source voltage line in a light emitting display device according to an embodiment of the present invention.
Figure 5:
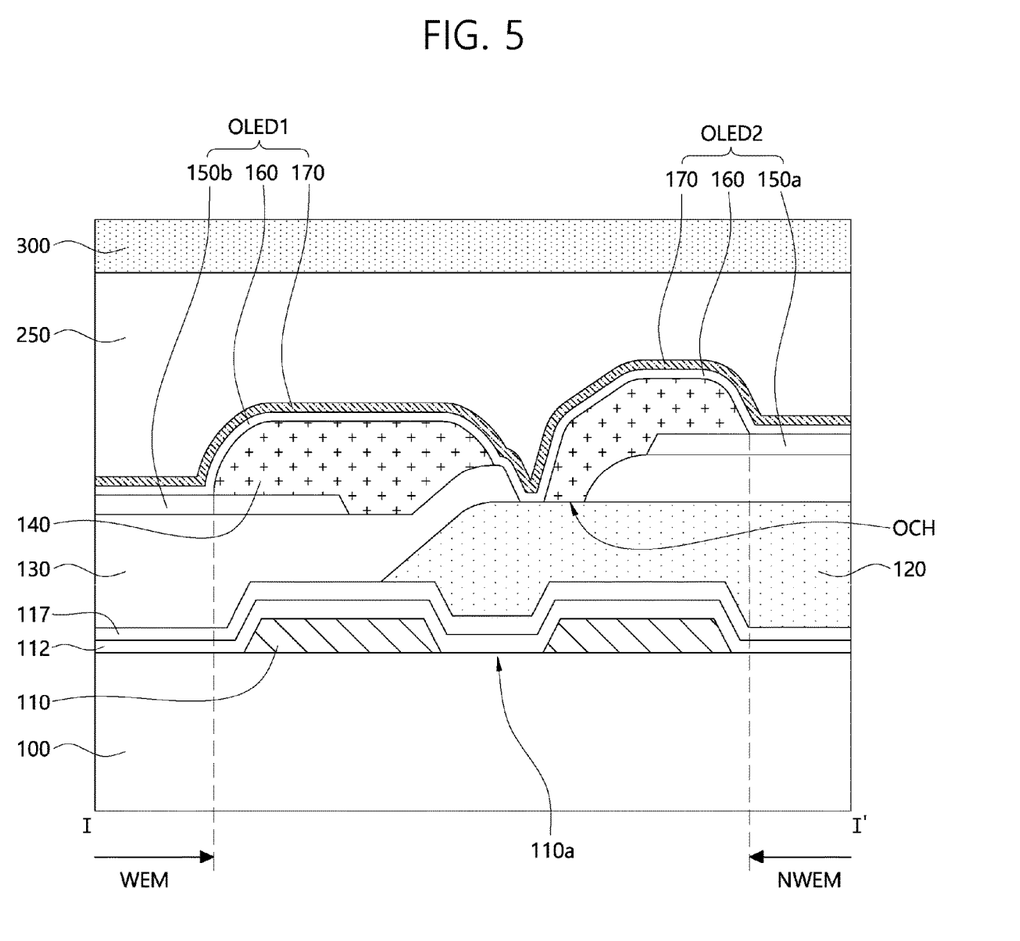
FIG. 5 is a sectional view taken along line I-I' of FIG. 4.
Figure 6:
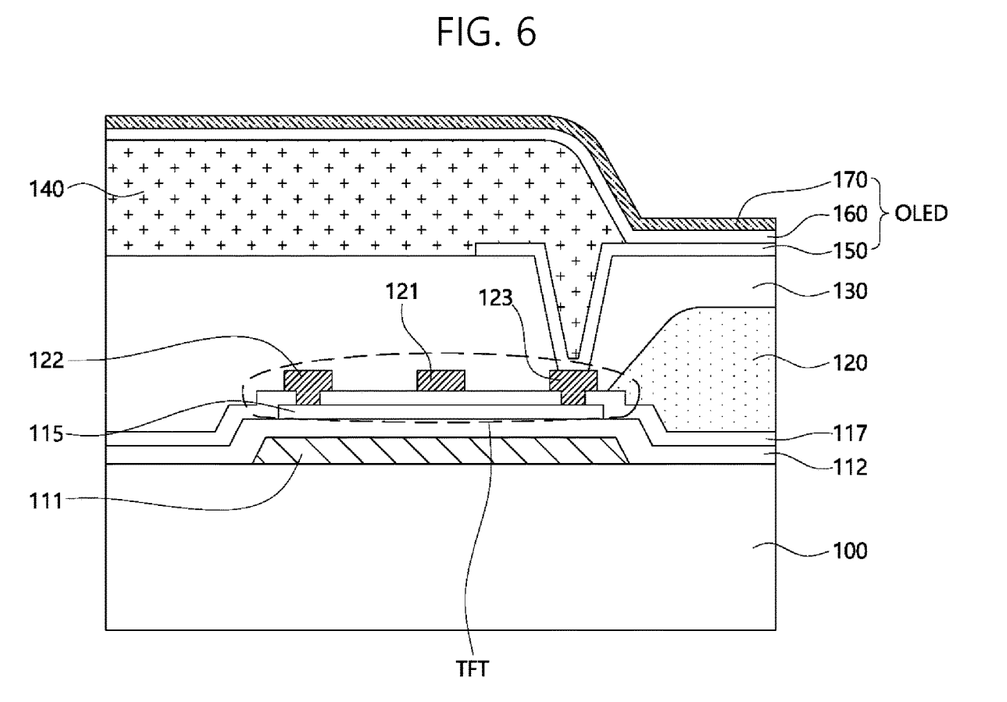
FIG. 6 is a sectional view showing connection between a thin film transistor and a light emitting element in the light emitting display device according to an embodiment of the present invention.

FIG. 4 is a plan view showing a white subpixel and a color subpixel provided on opposite sides of a source voltage line in a light emitting display device according to an embodiment of the present invention, FIG. 5 is a sectional view taken along line I-I' of FIG. 4, and FIG. 6 is a sectional view showing connection between a thin film transistor and a light emitting element in the light emitting display device according to one or more embodiments of the present invention.

As shown in FIGS. 4 and 5, the light emitting display device according to the embodiment of the present invention includes a white subpixel W_SP and a color subpixel NW_SP disposed on a substrate 100 so as to be adjacent to each other, the white subpixel W_SP and the color subpixel NW_SP respectively having emission portions WEM and NWEM (see FIG. 3) and driving circuits PC (see FIG. 3), a source voltage line 110 extending between the white subpixel W_SP and the color subpixel NW_SP adjacent to each other, the source voltage line 110 having at least a slit 110a parallel to the emission portions while being adjacent thereto, a color filter 120 overlapping the emission portion of the color subpixel NW_SP and the slit 110a, a first light emitting element OLED1 including a first anode 150b provided at the white subpixel W_SP so as not to overlap the slit 110a, and a second light emitting element OLED2 including a second anode 150a provided at the color subpixel NW_SP so as not to overlap the slit 110a.

As shown in FIG. 5, the first light emitting element OLED1 includes a first anode 150b, an organic layer including an emission layer, and a cathode 170. The second light emitting element OLED2 includes a second anode 150a, an organic layer including an emission layer, and a cathode 170. For example, the organic layer can include a hole injection layer, a hole transport layer, an emission layer, an electron transport layer, and an electron injection layer. Depending on circumstances, a plurality of stacks can be formed while being divided by a charge generation layer, and each stack can include a hole transport layer, an emission layer, and an electron transport layer. In addition, the organic layers 160 and the cathodes 170 of the first and second light emitting elements OLED1 and OLED2 can be integrally formed in at least a display area DA (see FIG. 2).

In the light emitting display device according to the present invention, each of the light emitting elements OLED (OLED1 and OLED2) emits white light, and white light can be expressed as a selective color by the color filter 120 disposed thereunder. For example, the color filter 120 can be a red filter, a green filter, or a blue filter.

Figure 7:
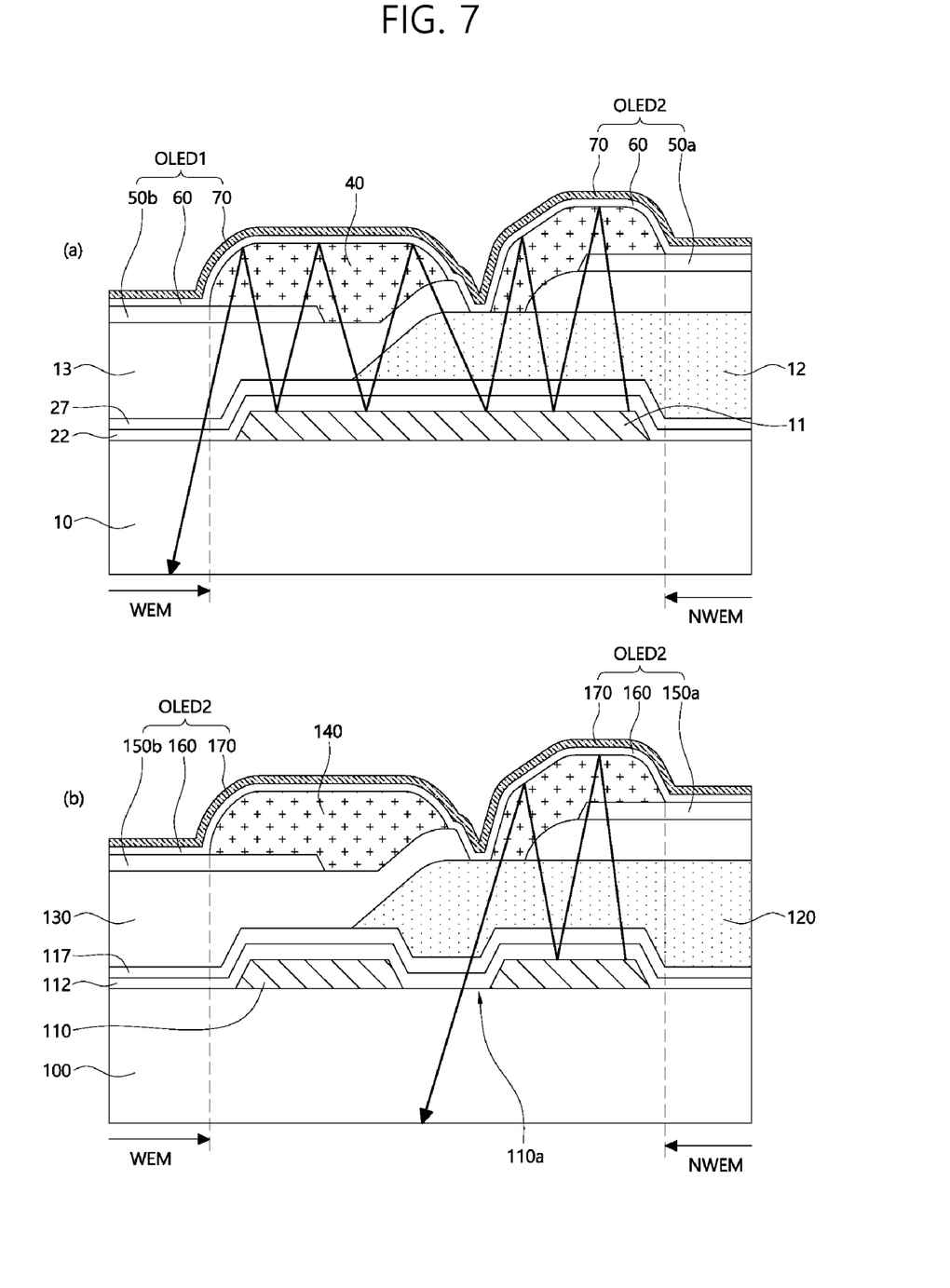
FIG. 7 is a view showing an optical path due to a source voltage line in light emitting display devices according to a first experimental example and an example of the present invention.

In the light emitting display device according to one or more embodiments of the present invention, the slit 110a provided in the source voltage line 110 located at the white subpixel and the color subpixel is formed by removing the interior of the source voltage line 110 by a predetermined width so that first and second portions P1 and P2 remains at opposite sides thereof, whereby an area to which foreign matter clings can be reduced, compared to the structure in which the space between the emission portions of the white subpixel W_SP and the color subpixel NW_SP is filled (see (a) of FIG. 7). For example, the area of approximately 30% to 40% in the space between the emission portion WEM of the white subpixel and the emission portion NWEM of the color subpixel adjacent to each other is filled with no metal wire due to the slit 110a, whereby a kind of opening is formed in the source voltage line 110. In this case, the area of the metal wire to which foreign matter clings is reduced by 30% to 40% in the space between the emission portion WEM of the white subpixel and the emission portion NWEM of the color subpixel, whereby foreign matter on the source voltage line 110 is reduced, whereby defects due to the foreign matter are reduced. In particular, when the foreign matter is conductive foreign matter, the area of the metal wire is reduced in the space between the emission portion WEM of the white subpixel and the emission portion NWEM of the color subpixel adjacent to each other by the provision of the slit 110a, whereby it is possible to more effectively prevent concentration of the conductive foreign matter. Consequently, it is possible to prevent defects due to foreign matter as the result of a reduction in area of the source voltage line 110.

In addition, since the slit 110a is provided in the source voltage line 110 located between the white subpixel W_SP and the color subpixel NW_SP, the path of light that is emitted from the color subpixel NW_SP, passes through the color filter 120, is reflected by the source voltage line 110, and advances to the side is blocked by the slit 110a, the optical path is changed by the slit 110a, and then the light is emitted outside. Since the color filter 120 overlaps the slit 110a, no other colors of light are visible from the slit 110a.

The anodes 150a and 150b do not overlap the slit 110a, whereby a component configured to distinguish between colors for each of the white subpixel and the color subpixel is not provided, and therefore no light is visible from the slit 110a.

In addition, the cathode 170 overlaps above the slit 110a of the source voltage line 110, whereby an overlap area between the cathode 170 and the source voltage line 110, to which constant source voltage is applied, is reduced, and therefore it is possible to reduce occurrence of parasitic capacitance. As a result, reliability of the light emitting display device is improved. For example, the source voltage line 110 having the slit 110a can be a reference source voltage line RL configured to apply reference source voltage, a driving source voltage line VDL configured to apply driving source voltage, or a ground source voltage line VSL configured to apply ground source voltage. In this case, the reference source voltage line RL is connected to a sensing transistor SE for degradation compensation. The overlap area between the reference source voltage line RL and the cathode 170 is reduced, whereby influence by the cathode 170 is reduced, and therefore degradation compensation ability is improved. As a result, improvement in lifespan of the light emitting display device can be achieved.

Each of the first anode 150b and the second anode 150a can overlap the source voltage line 110 while being spaced apart from the slit 110a. The reason for this is that it is necessary to sufficiently reduce parasitic capacitance through overlap between the cathode 170 and the slit 110a.

Further, in the overlap parts between the source voltage line 110 and the first and second anodes 150b and 150a, the first vertical distance between the first anode 150b and the source voltage line 110 can be less than the second vertical distance between the second anode 150a and the source voltage line 110. The reason for this is that the color subpixel NW_SP further includes the color filter 120.

Meanwhile, the source voltage line 110 can be the same layer as one of electrodes constituting thin film transistors formed on the substrate 100, and can be the same layer as a shielding metal layer 111 provided under an active layer (semiconductor layer) of FIG. 6 depending on circumstances.

For example, the thin film transistor (TFT) shown in FIG. 6 can be a driving transistor connected to the light emitting element OLED, includes an active layer 115, a gate electrode 121 overlapping a channel of the active layer 115, and a drain electrode 122 and a source electrode 123 connected to opposite sides of the active layer 115.

A gate dielectric film 117 can be provided between the active layer 115 and the gate electrode 121.

A shielding metal layer 111 corresponding to at least the channel of the active layer 115 and configured to shield light transmission can be included under the active layer 115. A buffer layer 112 can be further provided between the shielding metal layer 111 and the active layer 115.

Depending on circumstances, the drain electrode 122 and the source electrode 123 can be formed on the same layer as the shielding metal layer 111. In this case, the shielding metal layer can be patterned to form a shielding film corresponding to the channel (corresponding to the width of the gate electrode 121) and the drain electrode 122 and the source electrode 123 connected to the active layer 115 thereunder through the buffer layer 112 on the same layer.

In FIGS. 5 and 6, the source voltage line 110 on the same layer as the shielding metal layer is shown by way of example; however, the present invention is not limited thereto. The source voltage line 110 can be made of a metal, such as copper, titanium, aluminum, or chromium or an alloy including at least one thereof, or can include a plurality of metal layers.

A bank 140 overlapping the driving circuits PC of the white subpixel W_SP and the color subpixel NW_SP and the source voltage line 110 and located above edges of the first anode 150b and the second anode 150a can be further included.

As shown in FIG. 4, the bank 140 can be formed in the state in which the emission portions WEM and NWEM are excluded. FIG. 5 shows that the shape of the bank 140 includes a part that is not formed between adjacent subpixels. however, the present invention is not limited thereto. The shape of FIG. 5 shows the state in which, when the bank 140 is formed along a hole OCH of an overcoat layer 130, a part of a bank material is introduced into the hole of the overcoat layer 130 due to mobility of a liquid material, whereby the bank is disconnected between the adjacent subpixels. When the thickness of the material of the overcoat layer 130 is small or the width of the hole of the overcoat layer 130 is small, the banks 140 can be connected between the adjacent subpixels.

Meanwhile, the overcoat layer 130 can be provided between the first and second anodes 150b and 150a and the source voltage line 110, and can be located on the color filter 120. For example, the overcoat layer 130 can cover the color filter 120 in the color subpixel.

The overcoat layer 130 can have a hole OCH or a slit partially overlapping the slit 110a of the source voltage line 110 and a part of the source voltage line 110 around the slit 110a. The hole OCH of the overcoat layer 130 can be used as a path configured to discharge moisture or outgassing between the subpixels. The hole OCH of the overcoat layer 130 can be disposed between all subpixels, or can be disposed between a plurality of subpixels.

The overcoat layer 130 can be made of an organic material, such as photo acrylic. A material for forming the bank 140 flows into a part having a thickness of about 1 µm to 4 µm and having a hole OCH, whereby a part at which the banks 140 are not connected to each other can be generated between the adjacent subpixels. The part at which the banks 140 are not connected to each other between the adjacent subpixels can overlap the slit of the source voltage line 110. As shown in FIG. 5, the part at which the banks 140 are not connected to each other is a slit or trench of the bank. The width of the bank 140 overlapping the edge of the first anode 150b of the white subpixel and the width of the bank 140 overlapping the edge of the second anode 150a of the color subpixel can be different from each other.

In addition, the height of the edge of the bank 140 at the white subpixel side and the height of the edge of the bank 140 at the color subpixel side can be different from each other. In this case, the height of the edge of the bank 140 at the color subpixel side can be greater than the height of the edge of the bank 140 at the white subpixel side. For example, the uppermost end of the bank 140 of the color subpixel side can be disposed higher than the uppermost end of the bank 140 of the white subpixel side.

The trench/slit provided in the bank 140 can overlap the hole OCH of the overcoat layer 130.

In addition, one side of the trench/slit provided in the bank 140 can be disposed in the hole OCH of the overcoat layer 130.

As shown in FIG. 5, the trench/slit provided in the bank 140 can overlap the first slit 110a.

The source voltage line 110 can be at least one of a reference source voltage line, a driving source voltage line, and a ground source voltage line.

Meanwhile, at least one transparent dielectric film can be provided between the source voltage line 110 and the color filter 120. In this case, the transparent dielectric film can be any one of an oxide film, a nitride film, and an oxynitride film. In addition, the transparent dielectric film can be at least one of the buffer layer 112 provided between the shielding metal layer and the semiconductor layer (active layer) and the gate dielectric film 117 provided between the semiconductor layer and the gate electrode.

A capping layer can be further included on the cathode 150, which is the uppermost layer of each of the first and second light emitting elements OLED1 and OLED2.

The substrate 100 including the first and second light emitting elements OLED1 and OLED2 can be encapsulated with an opposite substrate 300 via an adhesive layer 250. The opposite substrate 300 can correspond to the opposite substrate 1120 of FIGS. 1 and 2, and a pad of the substrate 100 can protrude without being covered by the opposite substrate 300.

Figure 8:
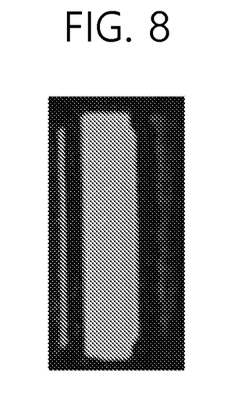
FIG. 8 is a photograph showing light leaked in the light emitting display devices according to the first experimental example.

FIG. 7 is a view showing an optical path due to a source voltage line in light emitting display devices according to a first experimental example and an example of the present invention, and FIG. 8 is a photograph showing light leaked of the light emitting display devices according to the first experimental example.

Particularly, (a) of FIG. 7 shows a first experimental example in which the source voltage line 11 has no slit, and (b) of FIG. 7 shows an example of the present invention in which the source voltage line 110 has a slit 110a.

In the first experimental example in (a) of FIG. 7, light emitted from a second light emitting element OLED2 of an emission portion NEWM of a color subpixel having a color filter 12 is reflected and re-reflected between an upper surface of the source voltage line 11 and a cathode 170, resonates a bank 40, an overcoat layer 13, a color filter 12, and transparent dielectric films 27 and 22, and is transferred to an emission portion WEM of a white subpixel adjacent thereto along the source voltage line 11 as a path. In this case, light emitted from the emission portion of the color subpixel can be visible from the emission portion WEM of a white subpixel.

FIG. 8 shows the case in which a color subpixel is a blue subpixel where the blue subpixel and a white subpixel are disposed adjacent to each other. When the blue subpixel is turned on, a part of the white subpixel is visible like a band.

In the light emitting display device according to the example of the present invention, as shown in (b) of FIG. 7, light emitted from a second light emitting element OLED2 of an emission portion NEWM of a color subpixel is reflected and re-reflected between an upper surface of the source voltage line 111 and a cathode 170, resonates a bank 140, an overcoat layer 130, a color filter 120, and transparent dielectric films 117 and 112, and moves along the source voltage line 110 as a path. In this case, however, side transfer of the light is blocked and the light is directed downwards through a slit 110a provided in the source voltage line 111, and the slit 110a overlaps the color filter 120, whereby the same color of light as the light emitted from the color subpixel NW_SP appears in the slit 110a, and therefore the slit 110a is not visible.

Meanwhile, a driving circuit of the light emitting display device according to one or more embodiments of the present invention and the position of the source voltage line having the slit will be described with reference to FIG. 9.

Figure 9:
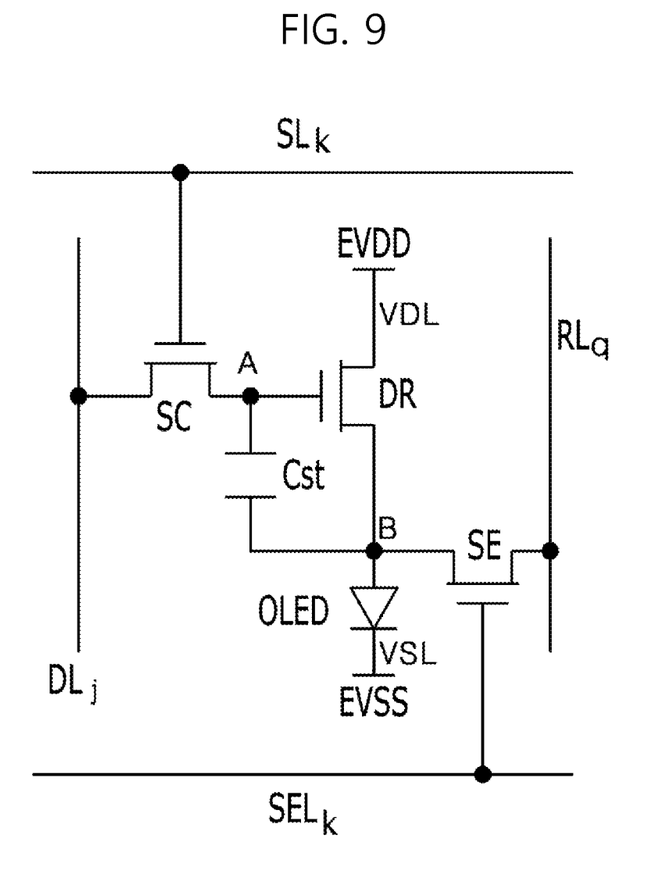
FIG. 9 is a circuit diagram of a subpixel of a light emitting display device according to an embodiment of the present invention.

FIG. 9 is a circuit diagram of a subpixel of a light emitting display device according to an embodiment of the present invention.

As shown in FIG. 9, the driving circuit in the subpixel of the light emitting display device according to one or more embodiments of the present invention includes a switching transistor SC, a driving transistor DR, a sensing transistor SE, and a storage capacitor Cst.

A ground source voltage line VSL configured to supply ground source voltage EVSS is connected to a cathode 170 of a light emitting element OLED.

The switching transistor SC is connected between a scan line $SL_k$ and a data line DLj that intersect each other, the driving transistor DR is connected to the switching transistor SC and a driving source voltage line VDL configured to supply driving source voltage EVDD.

On the assumption that a connection node between the driving transistor DR and the switching transistor SC is node A and a node corresponding to a source electrode of the driving transistor DR is node B, the storage capacitor Cst is formed between node A and node B.

Node B is a node connected to an anode of the light emitting element OLED.

In addition, the sensing transistor SE is connected between a reference source voltage line RLq and node B, and can receive a signal through a sensing line $SEL_k$.

The switching transistor SC is formed at the intersection between the scan line $SL_k$ and the data line DLj, and performs a function of selecting a corresponding subpixel. The driving transistor DR performs a function of driving a light emitting element OLED of a subpixel selected by the switching transistor SC connected through node A. The driving transistor DR is connected to the light emitting element OLED through node B and controls driving current of the light emitting element OLED. In addition, the sensing transistor SE is provided between node B and the reference source voltage line RLq, can supply a reference voltage signal from the reference source voltage line RLq to the light emitting element OLED according to an initialization signal or a sensing signal supplied from the sensing line $SEL_k$, and can perform a degradation compensation function.

In the pixel circuit PC of FIG. 9, the driving source voltage line VDL connected to the driving transistor DR, the ground source voltage line VSL connected to the cathode 170 (see FIGS. 5 and 6), and the reference source voltage line RLq connected to the sensing transistor SE can be the source voltage lines described with reference to FIGS. 3 to 6, and a slit can be formed within the width thereof, whereby it is possible to obtain the above effects of reducing foreign matter, preventing light leakage, and reducing parasitic capacitance at the cathode.

For example, in the light emitting display device according to the present invention, the slit is provided in the source voltage line located at the white subpixel and the color subpixel, whereby it is possible to reduce the area of the source voltage line to which foreign matter clings. Consequently, it is possible to prevent defects due to foreign matter as the result of a reduction in area of the source voltage line.

In addition, since the slit is provided in the source voltage line located between the white subpixel and the color subpixel, the path of light emitted from the color subpixel, passing through the color filter, reflected by the source voltage line, and advancing to the side is changed to be directed to the slit, and the changed path of light overlaps with the color filter, whereby it is possible to prevent light emitted from the color subpixel from being visible from the white subpixel.

In addition, the cathode overlaps above the slit of the source voltage line, whereby an overlap area between the cathode and the source voltage line 110, to which high constant source voltage is applied, is reduced, and therefore it is possible to reduce occurrence of parasitic capacitance. As a result, reliability of the light emitting display device is improved. For example, when the source voltage line having the slit is a reference source voltage line, the reference source voltage line is connected to the sensing transistor for degradation compensation. The overlap area between the reference source voltage line and the cathode is reduced, whereby influence by the cathode is reduced, and therefore degradation compensation ability is improved. As a result, improvement in lifespan of the light emitting display device can be achieved.

As is apparent from the above description, the light emitting display device according to the embodiments of the present invention has the following effects.

First, the slit is provided in the source voltage line located between the white subpixel and the color subpixel, whereby it is possible to reduce the area of the source voltage line to which foreign matter clings. Consequently, it is possible to prevent defects due to foreign matter as the result of a reduction in area of the source voltage line.

Second, since the slit is provided in the source voltage line located between the white subpixel and the color subpixel, the path of light emitted from the color subpixel, passing through the color filter, reflected by the source voltage line, and advancing to the side is changed to be directed to the slit, and the changed path of light overlaps with the color filter, whereby it is possible to prevent light emitted from the color subpixel from being visible from the white subpixel.

Third, the cathode overlaps above the slit of the source voltage line, whereby an overlap area between the cathode and the source voltage line 110, to which high constant source voltage is applied, is reduced, and therefore it is possible to reduce occurrence of parasitic capacitance. As a result, reliability of the light emitting display device is improved. For example, when the source voltage line having the slit is a reference source voltage line, the reference source voltage line is connected to the sensing transistor for degradation compensation. The overlap area between the reference source voltage line and the cathode is reduced, whereby influence by the cathode is reduced, and therefore degradation compensation ability is improved. As a result, improvement in lifespan of the light emitting display device can be achieved.

A display device according to one aspect of the present disclosure can comprise a white subpixel and a color subpixel adjacent to each other on a substrate, each of the white subpixel and the color subpixel having an emission portion and a driving circuit, a source voltage line extending between the white subpixel and the color subpixel adjacent to each other, the source voltage line having at least a first slit parallel to the emission portions, a color filter overlapping the emission portion of the color subpixel and the first slit, a first light emitting element at the white subpixel, the first light emitting element comprising a first anode not to overlap the first slit and a second light emitting element at the color subpixel, the second light emitting element comprising a second anode not to overlap the first slit.

In a display device according to one aspect of the present disclosure, each of the first anode and the second anode can be spaced apart from the first slit and overlaps the source voltage line.

In a display device according to one aspect of the present disclosure, in an overlapping part between the source voltage line and the first and second anodes, a first vertical distance between the first anode and the source voltage line can be less than a second vertical distance between the second anode and the source voltage line.

A display device according to one aspect of the present disclosure can further comprise a bank overlapping the driving circuit of each of the white subpixel and the color subpixel and the source voltage line. The bank can be located above an edge of each of the first anode and the second anode.

A display device according to one aspect of the present disclosure can further comprise an overcoat layer provided between the first and second anodes and the source voltage line. The overcoat layer can overlie the color filter in the color subpixel.

In a display device according to one aspect of the present disclosure, the overcoat layer can be provided with the first slit on the color filter and a second slit partially overlapping the source voltage line around the first slit.

In a display device according to one aspect of the present disclosure, the first light emitting element can have an organic layer and a cathode on the first anode, the second light emitting element can have the organic layer and the cathode on the second anode, extending from the first light emitting element, respectively. The cathode can overlap the first slit.

In a display device according to one aspect of the present disclosure, the source voltage line can be at least one of a reference source voltage line, a driving source voltage line, and a ground source voltage line.

In a display device according to one aspect of the present disclosure, the driving circuit can comprise a switching transistor, a driving transistor, a sensing transistor, and a storage capacitor. The ground source voltage line can be connected to the cathode. The switching transistor can be connected between a scan line and a data line that intersect each other. The driving transistor can be connected to the switching transistor and the driving source voltage line. The sensing transistor can be provided between the reference source voltage line and the first anode or the second anode.

In a display device according to one aspect of the present disclosure, the overcoat layer overlies the switching transistor, the driving transistor, and the sensing transistor. Each of the switching transistor, the driving transistor, and the sensing transistor can comprise a semiconductor layer, a gate electrode overlapping a channel of the semiconductor layer, and a source electrode and a drain electrode connected to opposite sides of the semiconductor layer. The light emitting display device can further comprise a shielding metal layer provided under the semiconductor layer in a state in which a buffer layer is located therebetween. The source voltage line can be an identical layer to the shielding metal layer.

In a display device according to one aspect of the present disclosure, the first slit can be located in a gap between the first anode and the second anode.

In a display device according to one aspect of the present disclosure, each of the first and second anodes can be a transparent electrode, and the cathode can comprise a reflective electrode.

In a display device according to one aspect of the present disclosure, the first slit can neighbor the emission portion of the white subpixel.

In a display device according to one aspect of the present disclosure, the bank have a slit, and a width of the bank overlapping an edge of the first anode of the white subpixel and a width of the bank overlapping an edge of the second anode of the color subpixel can be different from each other.

In a display device according to one aspect of the present disclosure, a height of the edge of the bank at the white subpixel and a height of the edge of the bank at the color subpixel can be different from each other.

In a display device according to one aspect of the present disclosure, the height of the edge of the bank at the color subpixel can be greater than the height of the edge of the bank at the white subpixel.

In a display device according to one aspect of the present disclosure, the slit provided in the bank and the second slit of the overcoat layer can overlap each other.

In a display device according to one aspect of the present disclosure, one side of the slit provided in the bank can be disposed in a hole of the overcoat layer.

In a display device according to one aspect of the present disclosure, the slit of the bank can overlap the first slit.

It will be apparent to those skilled in the art from the above description that various modifications and alterations are possible without departing the technical idea of the present invention. Therefore, the technical scope of the present invention should be restricted not by the above detailed description of the present invention but by the accompanying claims.

What is claimed is:

1. A light emitting display device comprising:
   a white subpixel and a color subpixel adjacent to each other on a substrate, each of the white subpixel and the color subpixel having an emission portion and a driving circuit;
   a source voltage line extending between the white subpixel and the color subpixel adjacent to each other, the source voltage line having a first slit parallel to the emission portions;
   a color filter overlapping the emission portion of the color subpixel and the first slit;
   a first light emitting element at the white subpixel, the first light emitting element having a first anode not to overlap the first slit; and
   a second light emitting element at the color subpixel, the second light emitting element having a second anode not to overlap the first slit.

2. The light emitting display device according to claim 1, wherein each of the first anode and the second anode is spaced apart from the first slit and overlaps the source voltage line.

3. The light emitting display device according to claim 2, wherein, in an overlapping part between the source voltage line and the first and second anodes, a first vertical distance between the first anode and the source voltage line is less than a second vertical distance between the second anode and the source voltage line.

4. The light emitting display device according to claim 2, further comprising:
   a bank overlapping the driving circuit of each of the white subpixel and the color subpixel and the source voltage line,
   wherein the bank is located above an edge of each of the first anode and the second anode.

5. The light emitting display device according to claim 1, further comprising:
   an overcoat layer provided between the first and second anodes and the source voltage line,
   wherein the overcoat layer overlie the color filter in the color subpixel.

6. The light emitting display device according to claim 5, wherein the overcoat layer is provided with a second slit partially overlapping the first slit and a part of the source voltage line around the first slit.

7. The light emitting display device according to claim 1, wherein the first light emitting element has an organic layer and a cathode on the first anode,
   the second light emitting element has the organic layer and the cathode on the second anode, extending from the first light emitting element, respectively, and
   the cathode overlaps the first slit.

8. The light emitting display device according to claim 7, wherein the source voltage line is at least one of a reference source voltage line, a driving source voltage line, and a ground source voltage line.

9. The light emitting display device according to claim 8, wherein the driving circuit comprises a switching transistor, a driving transistor, a sensing transistor, and a storage capacitor,
   the ground source voltage line is connected to the cathode,
   the switching transistor is connected between a scan line and a data line that intersect each other,
   the driving transistor is connected to the switching transistor and the driving source voltage line, and
   the sensing transistor is provided between the reference source voltage line and the first anode or the second anode.

10. The light emitting display device according to claim 9, wherein the overcoat layer overlies the switching transistor, the driving transistor, and the sensing transistor, each of the switching transistor, the driving transistor, and the sensing transistor comprises a semiconductor layer, a gate electrode overlapping a channel of the semiconductor layer, and a source electrode and a drain electrode connected to opposite sides of the semiconductor layer, the light emitting display device further comprises a shielding metal layer provided under the semiconductor layer in a state in which a buffer layer is located therebetween, and the source voltage line is an identical layer to the shielding metal layer.

11. The light emitting display device according to claim 1, wherein the first slit is located in a gap between the first anode and the second anode.

12. The light emitting display device according to claim 7, wherein each of the first and second anodes is a transparent electrode, and the cathode comprises a reflective electrode.

13. The light emitting display device according to claim 1, wherein the first slit neighbors the emission portion of the white subpixel.

14. The light emitting display device according to claim 6, wherein the bank has a slit, and a width of the bank overlapping an edge of the first anode of the white subpixel and a width of the bank overlapping an edge of the second anode of the color subpixel are different from each other.

15. The light emitting display device according to claim 1, wherein a height of the edge of the bank at the white subpixel and a height of the edge of the bank at the color subpixel are different from each other.

16. The light emitting display device according to claim 15, wherein the height of the edge of the bank at the color subpixel is greater than the height of the edge of the bank at the white subpixel.

17. The light emitting display device according to claim 14, wherein the slit provided in the bank and the second slit of the overcoat layer overlap with each other.

18. The light emitting display device according to claim 17, wherein one side of the slit provided in the bank is disposed in a hole of the overcoat layer.

19. The light emitting display device according to claim 14, wherein the slit of the bank overlaps the first slit.

* * * * *